(12) United States Patent
Soer et al.

(10) Patent No.: US 7,724,349 B2
(45) Date of Patent: May 25, 2010

(54) DEVICE ARRANGED TO MEASURE A QUANTITY RELATING TO RADIATION AND LITHOGRAPHIC APPARATUS

(75) Inventors: Wouter Anthon Soer, Nijmegen (NL); Maarten Marinus Johannes Wilhelmus Van Herpen, Heesch (NL); Niels Machiel Driessen, Valkenswaard (NL); Vadim Yevgenyevich Banine, Helmond (NL); Johannes Christiaan Leonardus Franken, Knegsel (NL); Olav Waldemar Vladimir Frijns, 's-Hertogenbosch (NL); Derek Jan Wilfred Klunder, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 23 days.

(21) Appl. No.: 11/797,358

(22) Filed: May 2, 2007

(65) Prior Publication Data

US 2008/0273188 A1 Nov. 6, 2008

(51) Int. Cl.
*G03B 27/42* (2006.01)
*G03B 27/54* (2006.01)

(52) U.S. Cl. .......................................... 355/53; 355/67

(58) Field of Classification Search .................. 355/30, 355/53, 67; 250/492.2, 492.22
See application file for complete search history.

(56) References Cited

U.S. PATENT DOCUMENTS

| 6,951,398 | B2 * | 10/2005 | Borra et al. ................. 359/846 |
| 7,256,868 | B2 * | 8/2007 | Akamatsu ..................... 355/53 |
| 2005/0190350 | A1 * | 9/2005 | Shinoda ....................... 355/53 |
| 2006/0215137 | A1 * | 9/2006 | Hasegawa et al. ............. 355/53 |
| 2007/0024972 | A1 * | 2/2007 | Kuerz et al. ................. 359/487 |
| 2008/0083885 | A1 * | 4/2008 | Van Herpen et al. ...... 250/493.1 |

OTHER PUBLICATIONS

Derek Jan Wilfred Klunder, U.S. Appl. No. 11/319,190, filed Dec. 28, 2005.

* cited by examiner

*Primary Examiner*—Hung Henry Nguyen
(74) *Attorney, Agent, or Firm*—Pillsbury Winthrop Shaw Pittman, LLP

(57) ABSTRACT

A device is arranged to measure a quantity relating to radiation. The device includes a sensor configured to measure the quantity, a screen arranged to protect the sensor from incoming particles emitted from a source configured to emit extreme ultraviolet radiation, and a mirror configured to redirect extreme ultraviolet radiation emitted by the source, past the screen, to the sensor.

19 Claims, 3 Drawing Sheets

US 7,724,349 B2

DEVICE ARRANGED TO MEASURE A QUANTITY RELATING TO RADIATION AND LITHOGRAPHIC APPARATUS

FIELD

The present invention relates to a device arranged to measure a quantity relating to radiation, a radiation source that includes such a device, and a lithographic apparatus that includes such a radiation source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to be able to project small patterns onto the substrate, radiation is used having a wavelength which is within the so-called extreme ultraviolet (EUV) range which is electromagnetic radiation having a wavelength typically between 5 nm and 40 nm. In addition to EUV radiation, EUV radiation sources generate contaminant material that may be harmful for both the optics, the sensors configured to measure a quantity relating to the radiation and the working environment in which the lithographic process is carried out. Such is especially the case for EUV sources operating via a laser-induced plasma. Hence, in lithography in which EUV radiation is used for projecting patterns onto the substrate, a desire exists to limit the contamination of the optical system that is arranged to condition the beams of radiation coming from the EUV source, as well as the aforementioned sensors.

It has been proposed to arrange a screen to protect the sensor from incoming particles emitted from the source. However, such a screen may be positioned between the source and the sensor, thereby blocking the radiation from the sensor.

In order to allow radiation to reach the sensor it has been proposed that a mirror is provided, the mirror being configured to redirect extreme ultraviolet radiation emitted by the source and passing the screen, to the sensor.

SUMMARY

It is desirable to provide a device in which the sensor is protected against incoming particles while radiation is allowed to reach the sensor.

According to an aspect, there is provided a device arranged to measure a quantity relating to radiation. The device comprises a sensor configured to measure the quantity, a screen arranged to protect the sensor from incoming particles emitted from a source configured to emit extreme ultraviolet radiation, and a mirror configured to redirect extreme ultraviolet radiation emitted by the source, past the screen, to the sensor.

According to another aspect, there is provided a radiation source configured to emit extreme ultraviolet radiation. The radiation source comprises a device arranged to measure a quantity relating to radiation. The device comprises a sensor configured to measure the quantity, a screen arranged to protect the sensor from incoming particles emitted from a source configured to emit extreme ultraviolet radiation, and a mirror configured to redirect extreme ultraviolet radiation emitted by the source, past the screen, to the sensor.

According to yet another aspect, there is provided a lithographic apparatus comprising an illumination system configured to condition a radiation beam, and a support constructed to support a patterning device. The patterning device is capable of imparting the radiation beam with a pattern in its cross-section to form a patterned radiation beam. The apparatus also includes a substrate table constructed to hold a substrate, a projection system configured to project the patterned radiation beam onto a target portion of the substrate, and a device arranged to measure a quantity relating to radiation. The device comprises a sensor configured to measure the quantity, a screen arranged to protect the sensor from incoming particles emitted from a radiation source configured to emit extreme ultraviolet radiation, and a mirror configured to redirect extreme ultraviolet radiation emitted by the source, past the screen, to the sensor.

According to an aspect of the invention, there is provided a mirror comprising a reflective layer. The reflective layer comprises a liquid metal which is a gallium alloy.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
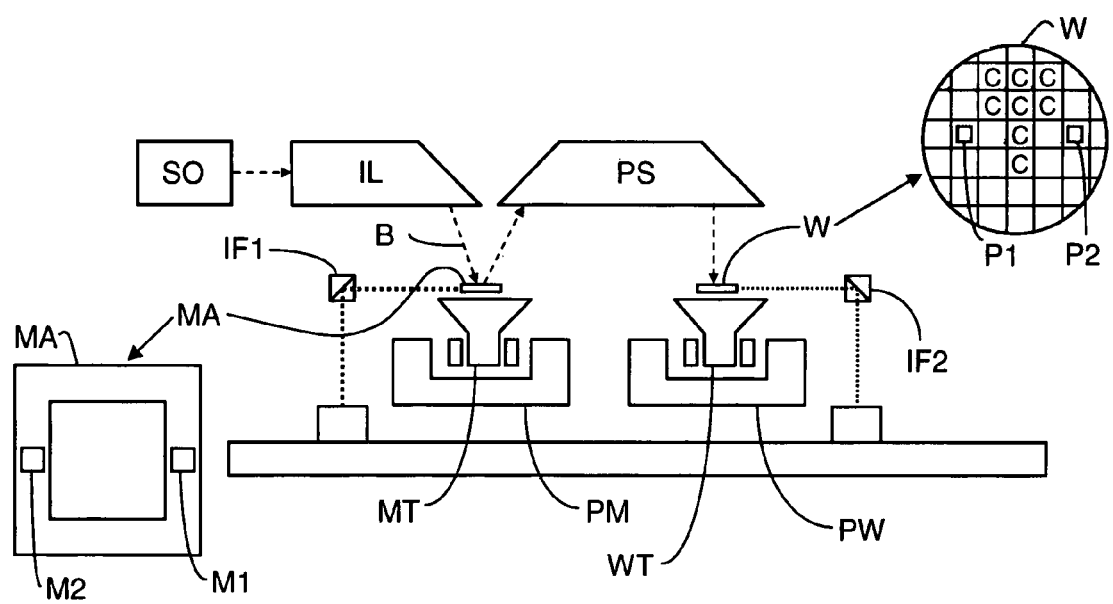
FIG. 1 depicts a lithographic apparatus according to an embodiment of the invention.

FIG. 1 schematically depicts a lithographic apparatus. The apparatus comprises: an illumination system (illuminator) IL configured to condition a radiation beam B (e.g. EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
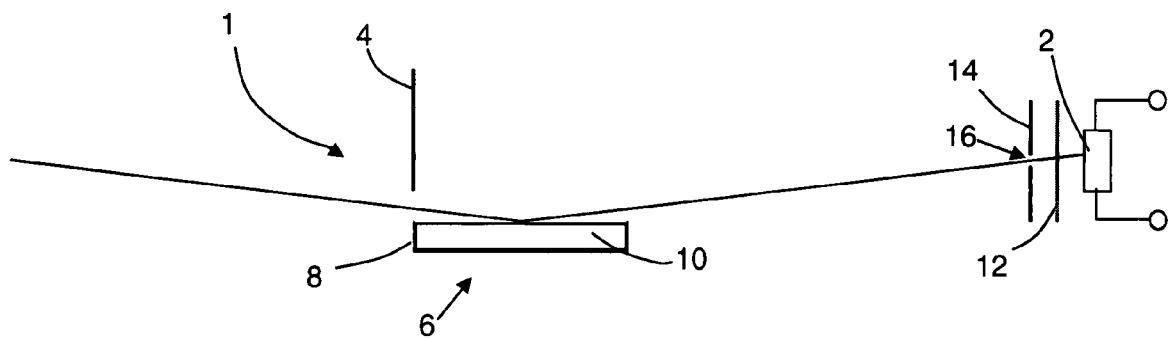
FIG. 2 is a schematic view of an embodiment of the device according to aspects of the invention.

FIG. 2 is a schematic view of a first embodiment of the device 1 according to the invention which may be applied in the lithographic apparatus of FIG. 1. The device 1 comprises a sensor 2, for instance a photodiode, configured to measure a quantity, such as dose or pulse energy of radiation emitted from the radiation source SO. In order to avoid damage incurred by incoming particles emitted from source, the device 1 may comprise a screen 4. Unfortunately, the screen 4 not only blocks out said particles, but also the extreme ultraviolet radiation emitted by the source SO. In order to allow the radiation to reach the sensor 2, a mirror 6 is configured to redirect the radiation which, in use, is emitted by the source SO and passes the screen 4, to the sensor 2. Thus, the particles are not able to hit the sensor 2, whereas the radiation is.

The mirror 6 comprises a reservoir 8 containing a reflective layer 10, the reflective layer 10 comprising material which is selected to be a liquid when the source is in operation. A suitable liquid may be tin. Another suitable material may be a gallium alloy, such as galinstan which is a eutectic alloy of gallium, indium and tin. Typically, in alloys containing gallium, indium and tin, the composition may be selected such that the alloy has a melting point below room temperature. This enables the use of the alloy as the liquid reflective layer 10 of the mirror 6 at a wide temperature range as compared with tin. Particularly, it eliminates the need for external heating of components that would normally have a temperature below the melting point of tin.

Moreover, alloys comprising gallium, such as the aforementioned galinstan, generally have good reflective properties for extreme ultraviolet radiation. Particularly, an alloy having about 63.3% gallium, 23.3% indium and 13.4% tin in atomic percentages has been found to be suitable to reflect extreme ultraviolet radiation.

Furthermore, such alloys have been found to be very suitable for absorbing particles emitted by the radiation source SO, especially if a significant portion of these particles are tin particles. An alloy having about 81.3% gallium and about 18.7% indium in atomic percentages has been found to be particularly suitable to absorb tin until the alloy comprises about 72.2% gallium, about 16.6% indium and about 11.2% tin in atomic percentages. Since the reflective layer 10 comprises a liquid, it will absorb any deposited microparticles while maintaining a low surface roughness.

Optionally, the device 1 comprises a filter 12 and a further screen 14 provided with a pinhole 16 through which radiation is transmitted to propagate to the filter 12 ultimately to the sensor 2 (FIG. 2).

Figure 3:
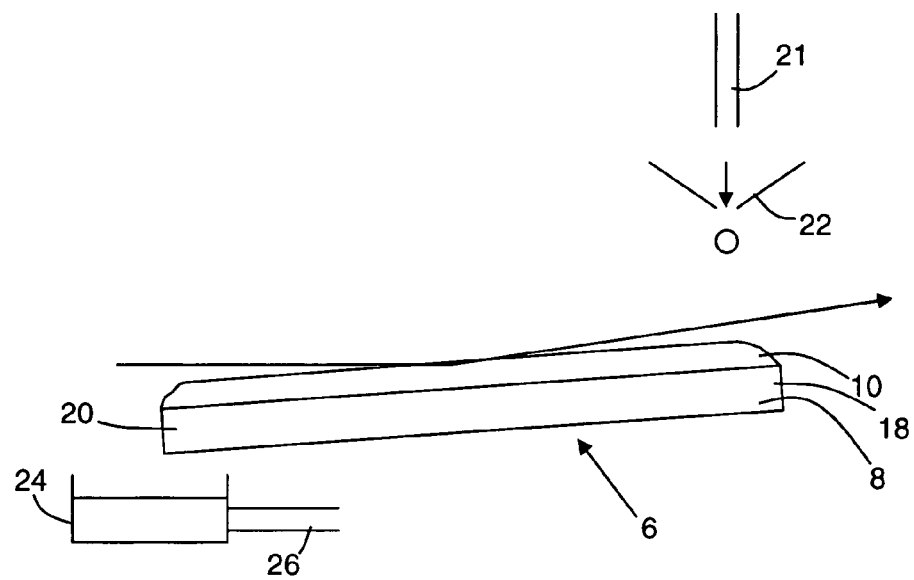
FIG. 3 is a schematic view a modification of the device of FIG. 2.

FIG. 3 depicts a modification of the device 1 of FIG. 2. In particular, FIG. 2 shows that the mirror 6 has a substrate 8 on which the reflective layer 10 is maintained. The substrate 8 comprises a first edge 18 and a second edge 20, and is tilted so that the first edge 18 is at a higher position than the second edge 20.

As FIG. 3 shows, the modification of the device 1 comprises an inlet 21 arranged to apply the liquid to the reflective layer 10 at a position near the first edge 18 of the substrate 8, thereby maintaining the reflective layer 10, and a dosage system 22 arranged to supply the liquid to the substrate 8 at a desired rate.

As can also be seen in FIG. 3, a collection reservoir 24 is provided which is arranged to collect liquid dropping from the substrate 8 near the second edge 20. The liquid may be drained away through an outlet 26.

Figure 4:
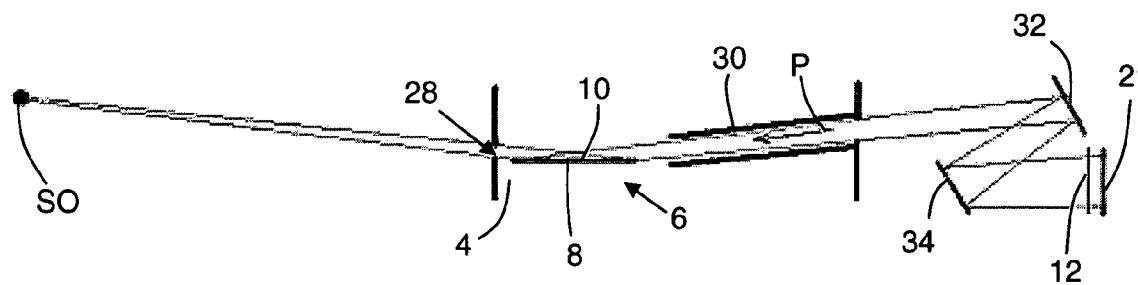
FIG. 4 is another embodiment of the device according to aspects of the invention

FIG. 4 depicts a second embodiment of the device 1. The device 1 shown in FIG. 4 differs from the device of FIG. 2 in that the screen 4 of the device 1 of FIG. 4 comprises a through-hole 28 through which the radiation to be reflected by the mirror 6 propagates. Furthermore, the device 1 of FIG. 4 comprises a duct 30 extending along a path of radiation propagating behind the screen 4 arranged to allow a gas to be fed through the duct 30 in a direction P opposite to the direction of propagation of the radiation emitted by the radiation source SO. The gas is a gas which is transparent to extreme ultraviolet radiation, such as argon, and the radiation transmitted propagates to a first mirror 32 and a second mirror 34, in the embodiment of FIG. 4 both multilayer mirrors 32, 34. Together with filter 12, the mirrors 32 and 34 form a band pass filter configured to filter out all electromagnetic radiation except in-band extreme ultraviolet radiation.

The mirror 6 of the device 1 of FIG. 4 may comprise a reservoir 8 containing the reflective layer 10 similar to the reservoir of FIG. 2. Alternatively, a modification similar to the modification of FIG. 3 may be applied.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A device arranged to measure a quantity relating to radiation, the device comprising:
   a sensor configured to measure the quantity;
   a screen arranged to protect the sensor from incoming particles emitted from a source configured to emit extreme ultraviolet radiation; and
   a mirror configured to redirect extreme ultraviolet radiation emitted by the source, past the screen, to the sensor.

2. A device according to claim 1, wherein the mirror comprises a reflective layer, the reflective layer comprising a material that at least partially liquefies when the source is in operation.

3. A device according to claim 2, wherein the material is a metal.

4. A device according to claim 2, wherein the material comprises one or more materials selected from the group consisting of: gallium, indium, lithium, and tin.

5. A device according to claim 1, wherein the mirror comprises a reflective layer, the reflective layer comprising a gallium alloy.

6. A device according to claim 1, wherein the quantity which the sensor is configured to measure is dose or pulse energy.

7. A radiation source configured to emit extreme ultraviolet radiation, the radiation source comprising:
   a device arranged to measure a quantity relating to radiation, the device comprising
   a sensor configured to measure the quantity,
   a screen arranged to protect the sensor from incoming particles emitted from a source configured to emit extreme ultraviolet radiation, and
   a mirror configured to redirect extreme ultraviolet radiation emitted by the source, past the screen, to the sensor.

8. A radiation source according to claim 7, wherein the mirror comprises a reflective layer, the reflective layer comprising a material that at least partially liquefies when the source is in operation.

9. A radiation source according to claim 8, wherein the material is a metal.

10. A radiation source according to claim 8, wherein the material comprises one or more materials selected from the group consisting of: gallium, indium, lithium, and tin.

11. A radiation source according to claim 7, wherein the mirror comprises a reflective layer, the reflective layer comprising a gallium alloy.

12. A radiation source according to claim 7, wherein the quantity which the sensor is configured to measure is dose or pulse energy.

13. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate;
    a projection system configured to project the patterned radiation beam onto a target portion of the substrate; and
    a device arranged to measure a quantity relating to radiation, the device comprising
    a sensor configured to measure the quantity,
    a screen arranged to protect the sensor from incoming particles emitted from a radiation source configured to emit extreme ultraviolet radiation, and
    a mirror configured to redirect extreme ultraviolet radiation emitted by the source, past the screen, to the sensor.

14. A lithographic apparatus according to claim 13, wherein the mirror comprises a reflective layer, the reflective layer comprising a material that at least partially liquefies when the source is in operation.

15. A lithographic apparatus according to claim 14, wherein the material is a metal.

16. A lithographic apparatus according to claim 14, wherein the material comprises one or more materials selected from the group consisting of: gallium, indium, lithium, and tin.

17. A lithographic apparatus according to claim 13, wherein the mirror comprises a reflective layer, the reflective layer comprising a gallium alloy.

18. A lithographic apparatus according to claim 13, wherein the quantity which the sensor is configured to measure is dose or pulse energy.

19. A device according to claim 1, further comprising a filter arranged to substantially remove non-extreme ultraviolet radiation and allow extreme ultraviolet radiation to be incident onto the sensor.

* * * * *